United States Patent [19]

Kaplinsky

[11] Patent Number: 5,028,821

[45] Date of Patent: Jul. 2, 1991

[54] PROGRAMMABLE LOGIC DEVICE WITH PROGRAMMABLE INVERTERS AT INPUT/OUTPUT PADS

[75] Inventor: Cecil H. Kaplinsky, Palo Alto, Calif.

[73] Assignee: Plus Logic, Inc., San Jose, Calif.

[21] Appl. No.: 487,750

[22] Filed: Mar. 1, 1990

[51] Int. Cl.⁵ .......................................... H03K 19/177
[52] U.S. Cl. .................................. 307/465; 307/468; 307/471
[58] Field of Search ............... 307/465, 468, 469, 471; 364/716; 340/825.83, 825.84, 825.87

[56] References Cited

U.S. PATENT DOCUMENTS

| | | | |
|---|---|---|---|
| 4,032,894 | 6/1977 | Williams | 340/166 R |
| 4,157,480 | 6/1979 | Edwards | 307/203 |
| 4,207,556 | 6/1980 | Sugiyama et al. | 340/166 R |
| 4,612,459 | 9/1986 | Pollachek | 307/465 X |
| 4,638,189 | 1/1987 | Geannopoulos et al. | 307/465 |
| 4,644,192 | 2/1987 | Fisher | 307/465 |
| 4,677,318 | 6/1987 | Veenstra | 307/465 |
| 4,703,206 | 10/1987 | Canlan | 307/465 |
| 4,717,912 | 1/1988 | Harvey et al. | 340/825.83 |
| 4,721,868 | 1/1988 | Cornell et al. | 307/465 |
| 4,758,746 | 7/1988 | Birkner et al. | 307/465 |
| 4,761,570 | 8/1988 | Williams | 307/465 |
| 4,829,203 | 5/1989 | Ashmore, Jr. | 307/469 |
| 4,912,345 | 3/1990 | Steele et al. | 307/468 X |
| 4,914,322 | 4/1990 | Win et al. | 307/469 X |

Primary Examiner—David Hudspeth
Attorney, Agent, or Firm—Schneck & McHugh

[57] ABSTRACT

A programmable logic device having a plurality of functional units, a programmable interconnect matrix for connecting the functional units together, input and output pins coupled to the interconnect matrix, and programmable inverters connected between the pins and conductive lines of the matrix to permit external signals leading into or out of the interconnect matrix to be inverted, if desired. Each functional unit may itself be a programmable logic device with inputs, an AND array connected to the inputs, an OR array connected to the AND array, optional registers and inverters on the output side of the OR array, and outputs coupled to the OR array, the registers or the inverters. The programmable interconnect matrix includes two sets of conductive lines crossing one another and connectable by programmable links at each intersection. The lines connect to functional unit inputs and to input and output pins.

23 Claims, 2 Drawing Sheets

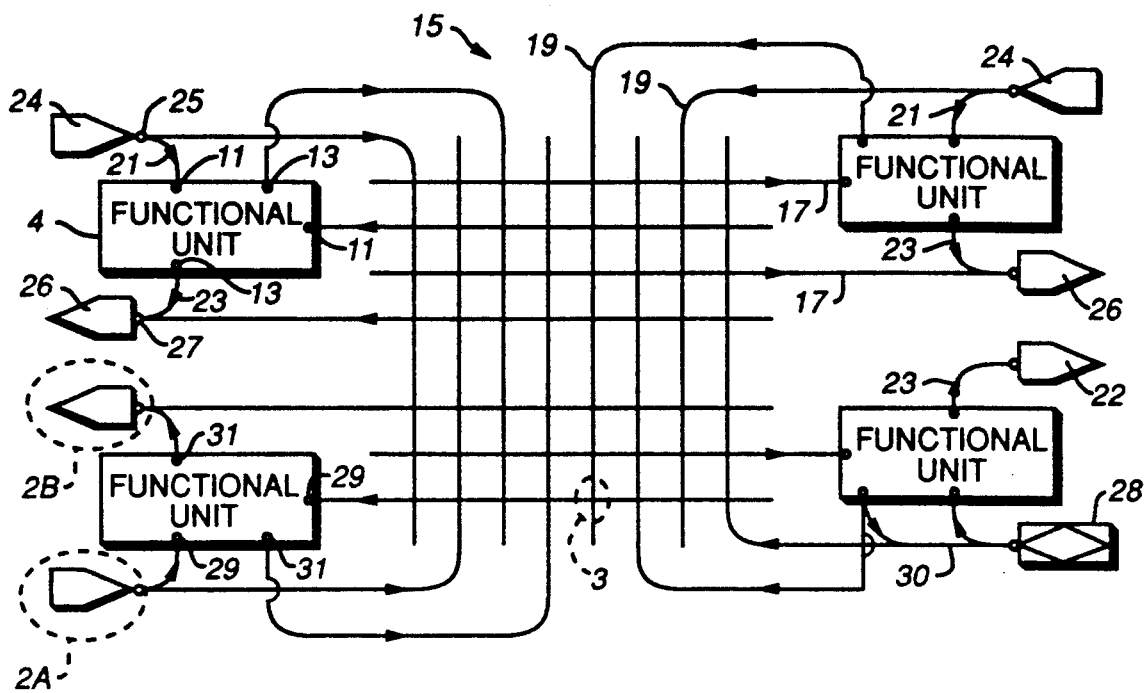
FIG._1
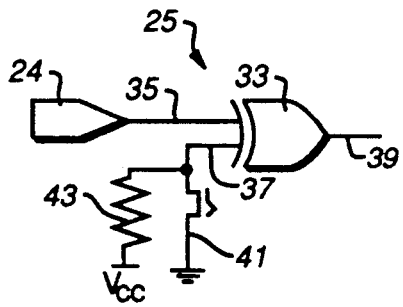
FIG._2A
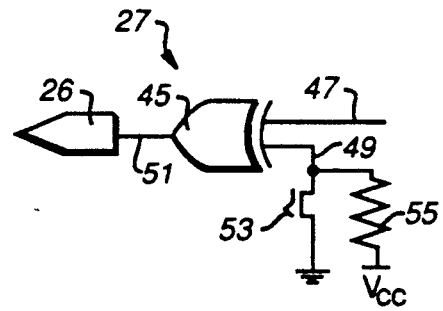
FIG._2B
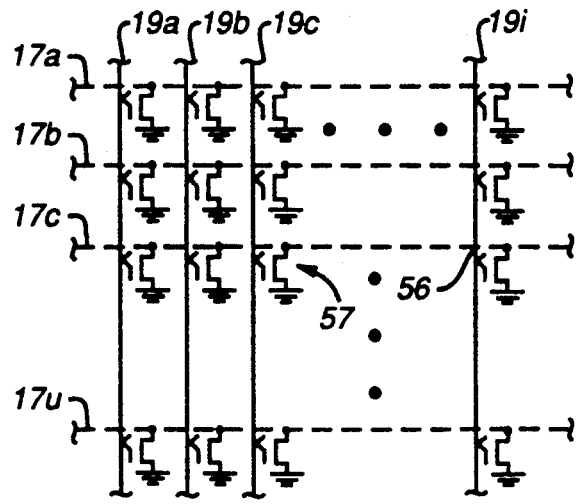
FIG._3

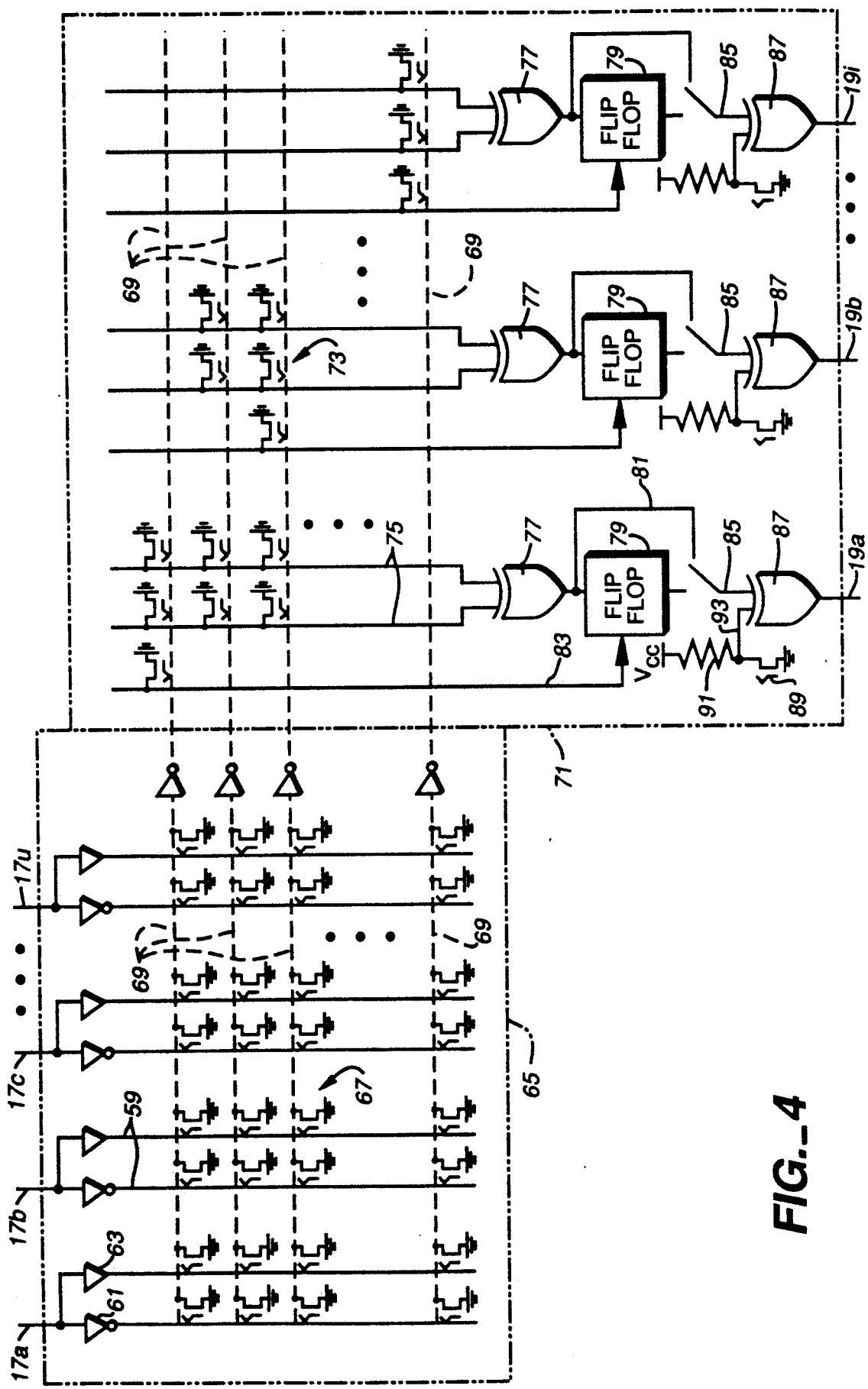
FIG._4

PROGRAMMABLE LOGIC DEVICE WITH PROGRAMMABLE INVERTERS AT INPUT/OUTPUT PADS

DESCRIPTION

1. Technical Field

The present invention relates to programmable logic devices of the type having logic functional units connected together with a programmable interconnect matrix, and in particular to programmable logic devices which include programmable inverters.

2. Background Art

In U.S. Pat. No. 4,157,480, Edwards describes a simple programmable inverter circuit comprising an EXCLUSIVE-OR GATE having a first input, a second input connected through a resistor to a reference voltage and through a programmable fuse link to ground, and an output. When the fuse link is closed, the output is the same as the first input, but when the fuse link is blown, the output is inverted with respect to the first input. The programmable inverter may be provided at either the inputs, outputs or both of logic gates to form selective AND/NAND gates and the like.

In U.S. Pat. No. 4,717,912, Harvey et al. describe an output structure for a logic circuit having both a register and a conductor connected to receive a logic signal, a multiplexer connected to the register output and the conductor so as to select either a stored or a nonstored signal, and an exclusive-OR gate with one input connected to the multiplexer to receive the selected signal, with an output connected to a pin, and with another programmable input connected as in Edwards to either invert or not invert the signal that is output to the pin.

In U.S. Pat. No. 4,644,192, Fisher describes a programmable array logic circuit having a programmable AND logic array, programmable OR gates connectable to selected product term lines from the AND array and a J-K register with J and K inputs coupled to the outputs of the OR gates. A programmable inverter is connected between the K input of the register and the output of the corresponding OR gate.

In U.S. Pat. No. 4,032,894, Williams describes a programmable logic array that comprises a set of input lines, a search (AND) array selectively connectable to the input lines, a complementary (NOT) array having a plurality of inverters selectively connectable to the AND array outputs, and a read (OR) array having input columns selectively connectable to the NOT array outputs and having a set of output rows. The NOT array provides a selection of both true and complement forms of each product term that is output from the AND array, thereby allowing an OR array output to represent the presence or absence of a particular input combination, or even some combination of both conditions, without requiring an excessive number of product terms that is costly to implement.

In U.S. Pat. No. 4,207,556, Sugiyama et al. describe a programmable logic array comprising a plurality of cell units and wiring for interconnecting the cell units. Each cell unit includes a function cell and an array unit. Each functional unit has a plurality of electronic elements (resistors, transistors, etc.), wiring interconnecting these elements and a group of switches for connecting and disconnecting them in various ways to form selected logic circuits, such as input decoders and flip-flops. Each array unit has a matrix of row and column lines, electronic elements at each row-column intersection and a group of switches for connecting row and column lines and the electronic elements in various ways to form AND and OR arrays.

In order to provide a high degree of functional flexibility it is desired that programmable logic devices (PLDs) be programmed as efficiently as possible for maximum logic density. In ordinary PLDs with an AND array and an OR array, the potential logic density is increased by providing inverters, either between the AND and OR arrays as taught by Williams, prior to the AND array, after the OR array, or some combination of the three. In a hierarchical type PLD like Sugiyama et al., it is not only desirable that the individual function units be efficiently programmed, but the same is desired for the interconnect array that connects the function units together.

It is an object of the present invention to provide a programmable logic device of the hierarchical type in which both the functional units and interconnect array have a high potential logic density for a high degree of functional flexibility, without a substantial speed penalty or a substantial increase in chip area.

DISCLOSURE OF THE INVENTION

The above object has been met with a programmable logic device of the type having plural logic functional units connected together with a programmable interconnect matrix in which a set of programmable inverters are disposed at the input and output pins of the device. These programmable inverters are in addition to any programmable inverters that may be provided as part of any logic functional unit, and permit external signals leading into or out of the interconnect matrix to be inverted, if desired. This allows the interconnect matrix to be more efficiently programmed, increasing the overall logic capacity of the device.

Each functional unit has a set of inputs and outputs and is individually programmable for carrying out one or more specified logic functions. Preferably, the functional units are themselves programmable logic devices with an AND array connected to the inputs and an OR array connected to the AND array and to the outputs. Typically, the inputs divide or branch into inverted and noninverted lines in the AND array so that both inverted and noninverted versions of the input signals are available for programming, Registers may be programmable connected between the OR array and the outputs, and programmable inverters may also be connected to the outputs of the functional units to provide additional flexibility. One or more of the functional units may have some inputs and outputs directly connectable to the input and output pins of the device, rather than or in addition to the interconnect matrix.

The programmable interconnect matrix includes two sets of conductive lines cross one another with programmable links at each intersection. Each link is selectively openable and closeable so as to connect any line of a first set with any line of the second set. Lines of the first set are permanently connected to inputs to the functional units. Other lines of the first set may be coupled to output pins of the device. Some of the lines of the second set are permanently connected to outputs of the functional units, while others are coupled to input pins of the device. As already noted, a principal feature of the invention is a set of programmable inverters which are connected between the input and output pins and their respective conductive lines. The inverters may be XOR gates having a first input and an output connected between a pin and a conductive line and having a second input connected to means for programming the XOR gate to invert or not invert the signal on its first input. Other features will become apparent from the description of the preferred embodiment.

BRIEF DESCRIPTION OF THE DRAWINGS

FIG. 1 is a functional schematic diagram of a programmable logic device of the present invention.

FIGS. 2A and 2B are circuit diagrams of programmable inverters connected to pins for use with the present invention, such as those inside dashed circles 2A and 2B in FIG. 1.

FIG. 3 is a circuit diagram showing an enlarged portion of a programmable interconnect matrix of the present invention, such as the portion within circle 3 in FIG. 1.

FIG. 4 is a detailed circuit diagram of a functional unit 4 for the device in FIG. 1.

BEST MODE FOR CARRYING OUT THE INVENTION

With reference to FIG. 1, a programmable logic device of the present invention includes a plurality of functional units 4, each having a set of inputs 11 and a set of outputs 13. Each functional unit 4 is individually programmable for carrying out one or more specified logic functions. While the number of functional units 4 shown in the device in FIG. 1 is four, the actual number may vary from one device to another. Typically, there are from four to twelve functional units in a device. The number of inputs 11 and outputs 13 may also vary. Twenty-one input, nine output functional units are typical. Each of the functional unit inputs 11 and outputs 13 in FIG. 1 actually represents a multiplicity of inputs and outputs.

The programmable logic device in FIG. 1 also includes a programmable interconnect matrix 15. Interconnect matrix 15 includes a first set of conductive lines 17 and a second set of conductive lines 19 which cross at intersections 3. In FIG. 1 the first set of conductive lines 17 is represented by the horizontal lines, while the second set of conductive lines 19 is represented by the vertical lines. Each of the conductive lines 17 and 19 shown in FIG. 1 actually represents a multiplicity of conductive lines. As will be described later, programmable links are present at the intersections of conductive lines 17 of the first set with conductive lines 19 of the second set. The programmable logic device of FIG. 1 also includes a plurality of input pins 24 and a plurality of output pins 26. Some pins 28 may be bidirectional.

Functional unit inputs 11 are permanently connected to conductive lines 17 of the first set. Functional unit outputs 13 are permanently connected to lines 19 of the second set. Functional unit inputs and outputs 11 and 13 may also be directly connected to respective input and output pins 24 and 26 via conductive lines 21 and 23 respectively. Alternatively, some or all of the functional units may be directly connected to bidirectional pins 28. In addition to being connected to functional unit inputs 11, some conductive lines 17 of the first set may be coupled to output pins 26. This is a purely optional feature, and some embodiments may have no direct outputs from the interconnect matrix 15 to the output pins 26. In addition to being connected to functional unit outputs 13, some conductive lines 19 of the second set are connected to input pins 24. Thus, signals on input pins 24 may either be input into directly connected functional units 4 at inputs 11 or be input into the interconnect matrix 15 along conductive lines 19 of the second set. Likewise, directly connected functional unit outputs 23 and, optionally, conductive lines 17 of the first set feed signals to the output pins 26. Some or all output pins 22 may only be connected to functional unit outputs 23 and not to any conductive lines 17 of the first set. Bidirectional pins 28 may be connected to both functional unit outputs and inputs with a path 30 sharing both input and output signals.

A principal feature of the present invention is that programmable inverters indicated by circles 25 and 27 are present on respective input and output pins 24 and 26. These programmable inverters 25 and 27 are in addition to the usual inverters 29 at the inputs 11 of functional units 4 as well as optional programmable inverters 31 on outputs 13 of functional units 4. It is well known that the presence of inverters 29 on the inputs of functional units 4 increases the programming efficiency and thus the ultimate logic density of the functional units. However, in hierarchical type programmable logic devices which employ a plurality of functional units 4, the programming efficiency of the interconnect matrix 15 is not improved substantially by the presence of inverters on the inputs of the functional units. The addition of programmable inverters 25 on the input pins 24 permits a selection of either the external signal or an inverted version of the external signal for use in making efficient programming interconnections within the interconnect matrix 15. Thus, the programming efficiency and logic density in the interconnect matrix region can be substantially improved. Similarly, it has been known to provide programmable inverters to the output side of functional units in simple programmable logic devices. While inverters 31 on the outputs 13 make available a selection of output polarity at output pins 26 for those signals received from directly connected outputs 13 of functional units 4, and while they also make available polarity selection for signals transmitted from functional units 4 to the interconnect matrix 15, no polarity selection has previously been available for output pins 26 receiving their signals directly from the interconnect matrix 15. Providing programmable inverters 27 on the output pins 26 enables the selection and thereby providing additional flexibility.

With reference to FIG. 2A, a programmable inverter 25 preferably includes an exclusive-OR gate 33 having a first input 35 connected to input pin 24, a second input 37 and having an output 39. The second input 37 is connected to an EPROM 41 leading to ground and a resistor 43 leading to a power supply voltage $V_{cc}$. Likewise, in 2B, a programmable inverter 27 includes an exclusive-OR gate 45 having a first input 47, a second input 49 and an output 51 connected to output pin 26. The second input 49 is connected to a EPROM 53 leading to ground and to a resistor 55 leading to a power supply voltage $V_{cc}$. In each case the first input 35 or 47 and the output 39 or 51 is connected between a pin 24 or 26 and a conductive line 17 of the first set. Programming the EPROMs 41 and 53 so that they are always off causes a high logic signal to be present on the second inputs 37 and 49. In that state the signal of the first input 35 or 47 is inverted by the exclusive-OR gates 53 and 45, and the inverted signal is output on lines 59 or 51. When EPROMs 41 and 53 are programmed so that they are always on, the signal on the second inputs 37 and 49 are logic low. In that instance, the signals on input lines 35 and 47 are not inverted by the exclusive-OR gates 33 and 45.

With reference to FIG. 3, the programmable interconnect matrix 15 includes programmable links at the intersections of each conductive line 17 of the first set with each conductive line 19 of the second set. Each of the links is selectively openable or closeable so as to connect a line 17 of the first set with a line 19 of the second set. The portion of the programmable interconnect matrix 15 that is shown in FIG. 3 includes a multiplicity of conductive lines 17a, 17b, 17c, ..., 17u of the first set leading to an input of the functional unit 4 and a multiplicity of lines 19a, 19b, 19c, ..., 19i of the second set leading from an output of the functional unit 4. The lines 17a–u and 19a–i intersect at crossings 56 but are not actually electrically connected at the intersections 56 because the lines 17 and 19 are on separate levels. The programmable links shown in FIG. 3 are EPROMs 57 located at the crossings 56 of lines 17 of the first set and lines 19 of the second set. Programming the EPROMs 57 connects or disconnects the lines 17 of the first set to the lines 19 of the second set. It is well known that mask selected ROMs, fuses and E$^2$PROMs can also be used in place of EPROMs.

With reference to FIG. 4, the preferred functional unit is itself a programmable logic device. The programmable logic device FIG. 4 includes a plurality of inputs 17a, 17b, 17c, ..., 17u connected to a conductive line of the first of the interconnect matrix 15. The input lines 17a–u branch or divide into pairs of lines 59, one line of a pair having an inverter 61 which inverts the signal received from the input line 17, the other of the pair of lines 59 having a buffer 63 which does not invert the input signal at the input line 17. The programmable logic device in FIG. 4 also includes an AND array 65. The AND array includes the pairs of lines 59 containing the inverted and noninverted input signals, programmable links 67, which may be EPROMs, EEPROMs, fuses or mask selected ROMs, and product term lines 69 which cross the pairs of lines 59. Programming the links 67 connects selected lines 59 with selected product term lines 69.

The programmable logic device also includes an OR array 71 connected to the AND array 65. The OR array 71 includes the product term lines 69, programmable links 73, which may be EPROMs, EEPROMS, fuses or mask selected ROMs, conductive lines 75 which are the inputs to exclusive-OR gates 77. Instead of exclusive OR gates, OR gates or NOR gates can also be used. Programming the links 73 connects selected product lines 69 to selected input lines 75 to exclusive OR gates 77.

Outputs of the exclusive OR gates 77 may be connected to flip-flops 79. A conductive line 81 connects to the input side of the flip-flops 79. A switch 85 selects between the flip-flop output and the flip-flop input. A clock input line 83 connected to selected product term lines 69 via programmable links 73 controls each flip-flop 79.

The programmable logic device may also include programmable inverters, in the form of exclusive OR gates 87 having a first input connected to switch 85, a second input 93 connected via an EPROM 89 to ground and via a resistor 91 to a power supply voltage $V_{cc}$, and an output 19. Programming the EPROM 89, which may also be an EE-PROM or a fuse, causes the exclusive OR gate 87 to invert or not invert the signal from switch 85 on the first input. The outputs 19a–i from gates 87 also form the outputs to the programmable logic device. Other programmable logic devices may be used instead of the one shown in FIG. 4 for the functional units.

The present invention with its programmable inverters on the inputs and output pins provides substantially improved logic density in the programmable interconnect matrix. An increase of 10–15 percent in logic density is expected. Hierarchical programmable logic devices like that described above provide advantages of ease in programming, functional flexibility and speed for complex logic functions when compared to nonhierarchical logic devices of the same functional capabilities. Increasing the logic density of the interconnect matrix by way of programmable inverters on the input and output pins enables one to use either a smaller programmable logic device for the same functionality or provides greater functionality for a particular programmable logic device.

I claim:

1. A programmable logic device comprising,
   a plurality of functional units, each functional unit having a set of inputs and a set of outputs, each functional unit being programmable for carrying out one or more specified logic functions,
   a plurality of input and output pins,
   programmable means for selectively coupling together said sets of inputs and outputs of said functional units and said input and output pins, wherein said programmable coupling means includes a matrix of crossing conductive lines with programmable links at intersections of conductive lines for selectively connecting said crossing conductive lines, each of said conductive lines being coupled to one of said input pins, output pins and functional unit inputs and outputs, and
   a set of programmable inverters connected between said pins and said programmable coupling means.

2. The device of claim 1 wherein each inverter of said set of programmable inverters comprises an XOR gate having a first input and an output connected between one of said pins and said programmable coupling means, said XOR gate also having a second input connected to means for programming said XOR gate to invert or not invert said first input at said output.

3. A programmable logic device comprising,
   a plurality of functional units, each functional unit having a set of inputs and a set of outputs, each functional unit being programmable for carrying out one or more specified logic functions, wherein each functional unit is a programmable logic device with an AND array connected to said set of inputs and an OR array connected to said AND array and to said set of outputs,
   a plurality of input and output pins,
   programmable means for selectively coupling together said sets of inputs and outputs of said functional units and said input and output pins, and
   a set of programmable inverters connected between said pins and said programmable coupling means.

4. The device of claim 3 wherein each inverter of said set of programmable inverters comprises an XOR gate having a first input and an output connected between one of said pins and said programmable coupling means, said XOR gate also having a second input connected to means for programming said XOR gate to invert or not invert said first input at said output.

5. A programmable logic device comprising, a plurality of functional units, each functional unit having a set of inputs and a set of outputs, each functional unit being programmable for carrying out one or more specified logic functions, a plurality of input and output pins, wherein at least one of said pins is bidirectional, programmable means for selectively coupling together said sets of inputs and outputs of said functional units and said input and output pins, and a set of programmable inverters connected between said pins and said programmable coupling means.

6. The device of claim 5 wherein each inverter of said set of programmable inverters comprises an XOR gate having a first input and an output connected between one of said pins and said programmable coupling means, said XOR gate also having a second input connected to means for programming said XOR gate to invert or not invert said first input at said output.

7. A programmable logic device comprising, a plurality of functional units, each functional unit having a set of inputs and a set of outputs, each functional unit being individually programmable for carrying out one or more specified logic functions, a programmable interconnect matrix including a first set of conductive lines, a second set of conductive lines crossing said first set of conductive lines and programmable links at the intersections of each conductive line of the first set with a conductive line of the second set, each of said links being selectively openable and closeable so as to connect any line of said first set with any line of said second set, inputs of said functional units being permanently connected to conductive lines of said first set, outputs of said functional units being permanently connected to some of the conductive lines of said second set, a plurality of input pins coupled to other conductive lines of said second set, a plurality of output pins connected to outputs of said functional units, and a set of programmable inverters connected between said input pins and said conductive lines of said second set.

8. The device of claim 7 wherein each functional unit is a programmable logic device with an AND array connected to said set of inputs and an OR array connected to said AND array and to said set of outputs.

9. The device of claim 8 wherein said functional units include registers programmably connected between an OR array and the output.

10. The device of claim 8 wherein said functional units include programmable inverters connected to said set of outputs.

11. The device of claim 8 wherein each said functional unit has a set of inputs which divides into main noninverted lines of said AND array and branched inverted lines of said AND array.

12. The device of claim 7 wherein at least one of said functional units is directly connectable to an input pin.

13. The device of claim 7 wherein at least one of said output pins is coupled to at least one of said conductive lines of said first set, at least one programmable inverter being connected between said at least one output pin and the conductive line of the first set to which said at least one output pin is coupled.

14. The device of claim 7 wherein at least one of said pins is bidirectional.

15. The device of claim 7 wherein each inverter of said set of programmable inverters comprises an XOR gate having a first input and an output connected between said input pin and said conductive line of said second set and having a second input connected to means for programming said XOR gate to either invert or not invert said first input at said output.

16. The device of claim 7 wherein said programmable links are selected from the group consisting of mask selected ROMs, fuses, EPROMs and EEPROMs.

17. A programmable logic device comprising, a plurality of programmable logic devices having a set of inputs, an AND array connected to said set of inputs, an OR array connected to said AND array and a set of outputs connected to said OR array, at least said AND array being programmable for specifying one or more logic functions to be carried out, a programmable interconnect matrix including a first set of conductive lines, a second set of conductive lines crossing said first set of conductive lines and programmable links at the intersections of each conductive line of the first set with a conductive line of the second set, each of said links being selectively openable and closeable so as to connect any line of said first set with any line of said second set, inputs of said plurality of programmable logic devices being permanently connected to some of the conductive lines of said first set, outputs of said plurality of programmable logic devices being permanently connected to some of the conductive lines of said second set, a plurality of input pins coupled to other conductive lines of said first set, a plurality of output pins coupled to other conductive lines of said second set, and a set of XOR gates, each XOR gate having a first input and an output connected between one of said pins and a conductive line, each XOR gate also having a second input connected to means for programming said XOR gate to invert or not invert said first input at said output.

18. The device of claim 17 wherein said programmable logic devices include registers programmable connected between said OR array and said output.

19. The device of claim 17 wherein said programmable logic devices include programmable inverters connected to said set of outputs.

20. The device of claim 17 wherein said set of inputs of each said programmable logic device branches into pairs of inverted and noninverted lines of said AND array.

21. The device of claim 17 wherein at least one of said programmable logic devices has outputs of said set of outputs that are directly connectable to output pins and has inputs of said set of inputs that are directly connectable to input pins.

22. The device of claim 17 wherein said programmable links are selected from the group consisting of mask selected ROMs, fuses, EPROMs and EEPROMs.

23. A programmable logic device comprising, a programmable interconnect matrix including a first set of conductive lines, a second set of conductive lines crossing said first set of conductive lines and programmable links at the intersections of each conductive line of said first set with a conductive line of said second set, each of said links being selectively openable and closeable so as to connect any line of said first set with any line of said second set,
a plurality of input pins coupled to conductive lines of said second set,
a plurality of output pins coupled to conductive lines of said first set, and
a set of programmable inverters connected between said input and output pins and the corresponding conductive lines of the second and first sets, respectively, to which said input and output pins are coupled.

* * * * *